United States Patent [19]

Saito et al.

[11] Patent Number: 4,929,572
[45] Date of Patent: May 29, 1990

[54] DOPANT OF ARSENIC, METHOD FOR THE PREPARATION THEREOF AND METHOD FOR DOPING OF SEMICONDUCTOR THEREWITH

[75] Inventors: Shigeaki Saito; Toshiharu Matsueda, both of Tokyo; Yoshihiro Kubota, Gunma; Masaaki Iguchi, Tokyo, all of Japan

[73] Assignees: Furukawa Co., Ltd.; Shin-Etsu Chemical Co., Ltd., Tokyo, Japan

[21] Appl. No.: 380,616

[22] Filed: Jul. 17, 1989

[30] Foreign Application Priority Data

Jul. 18, 1988 [JP] Japan ............................ 63-178836

[51] Int. Cl.$^5$ ............... H01L 21/00; H01L 21/02; H01L 21/225; H01L 21/22
[52] U.S. Cl. .............................. 437/164; 437/141; 437/160; 252/950; 501/154; 423/87; 427/372.2
[58] Field of Search ............... 437/141, 160, 161, 162, 437/164, 168; 501/154; 423/87, 344; 252/950, 951; 427/96, 372.2, 375

[56] References Cited

U.S. PATENT DOCUMENTS

| | | | |
|---|---|---|---|
| 3,879,230 | 4/1975 | Nakamura | 437/30 |
| 4,211,821 | 7/1980 | Hadni | 427/240 |
| 4,277,525 | 7/1981 | Nakayama et al. | 427/387 |
| 4,430,188 | 2/1984 | Cohn | 502/101 |
| 4,525,429 | 6/1985 | Raiser et al. | 437/168 |
| 4,526,826 | 7/1985 | Ten Eyck et al. | 437/169 |
| 4,798,764 | 1/1989 | Tressler et al. | 437/168 |

FOREIGN PATENT DOCUMENTS 0054270 3/1984 Japan.
0006200 1/1986 Japan.
0105999 5/1987 Japan.

*Primary Examiner*—Brian E. Hearn
*Assistant Examiner*—B. Everhart
*Attorney, Agent, or Firm*—McAulay, Fisher, Nissen & Goldberg

[57] ABSTRACT

The dopant body of arsenic for doping of a semiconductor substrate, e.g., silicon wafer, is a sintered body of a powder mixture comprising silicon arsenide, silica and, optionally, arsenic oxide in a specified proportion. The dopant body can be easily prepared and has various advantages over conventional elementary arsenic powder or a shaped body of silicon arsenide alone in respect of the high mechanical strength of the dopant body and absence of the problem of environmental contamination.

9 Claims, No Drawings

DOPANT OF ARSENIC, METHOD FOR THE PREPARATION THEREOF AND METHOD FOR DOPING OF SEMICONDUCTOR THEREWITH

BACKGROUND OF THE INVENTION

The present invention relates to a dopant body of arsenic and a method for the preparation thereof. More particularly, the invention relates to a composite sintered dopant body of arsenic used for doping of a semiconductor such as high-purity silicon, which can be easily prepared and has various advantages in use such as easiness in handling, absence of the problem of dust scattering to cause environmental contamination, long life as a dopant and inexpensiveness and a method for the preparation of such a dopant body of arsenic. The invention also relates to a method for a doping treatment of a semiconductor such as silicon wafers by using the above mentioned dopant body of arsenic.

In the manufacturing process of semiconductor devices, semiconductor substrates such as a high-purity silicon wafer are sometimes doped with arsenic. It is a conventional way that the doping treatment of a silicon wafer with arsenic is conducted by encapsulating the silicon wafer and elementary arsenic in a powdery form in a capsule under vacuum and heating the capsule. A problem in this method is that, when the surface of the arsenic particles is in an oxidized condition, the silicon wafer must be subjected to a heat treatment in vacuum beforehand.

With an object to avoid the troublesomeness of the above mentioned preliminary heat treatment, Japanese Patent Publication No. 53-44789 proposes a method by using silicon arsenide in a crystalline form as the dopant of arsenic. According to the disclosure, a simple pretreatment is sufficient to precede the doping treatment of a silicon wafer which can be conducted to give an accurately controlled amount of arsenic doping without producing any crystalline defects on the surface of the silicon wafer. As a modification of this method using silicon arsenide, Japanese Patent Publications Nos. 57-22209 and 57-22210 propose that the silicon arsenide is shaped into the form of a disc or pellet to facilitate handling in the doping treatment of semiconductor wafers. One of the serious disadvantages in the use of silicon arsenide as an arsenic dopant, which greatly limits the versatility of the method, is due to the fact the silicon arsenide as shaped has a multilayered laminar structure susceptible to cleavage into layers in addition to the low hardness to cause some inconveniences in handling or to decrease the serviceable life of the dopant body with little possibility of repeated use thereof.

SUMMARY OF THE INVENTION

The present invention accordingly has an object to provide a novel dopant body of arsenic free from the above described problems and disadvantages in the conventional dopant bodies of arsenic for the doping treatment of semiconductor substrates as well as a method for the doping treatment of a semiconductor substrate with arsenic by using the dopant body.

Thus, the dopant body of arsenic provided by the invention is a sintered body of a powder mixture comprising 100 parts by weight of a powder of silicon arsenide and from 100 to 300 parts by weight of a silica powder. The powder mixture may further comprise up to 200 parts by weight of an arsenic oxide such as $As_2O_5$ and $As_2$ and $O_3$ and the like per 100 parts by weight of the silicon arsenide.

The above defined dopant body of arsenic can be prepared by mixing powders of silicon arsenide, silica and, optionally, arsenic oxide in the above specified proportion to give a uniform powder mixture, compression-molding the powder mixture into a shaped body and subjecting the shaped body to a heat treatment at a temperature in the range from 800° C. to 1200° C. to give a sintered body.

Further, the doping treatment of a semiconductor substrate in the form of a wafer with arsenic can be performed by holding the semiconductor wafer to face the sintered dopant body of arsenic described above, which is preferably in the form of a disc or wafer, in an inert atmosphere and heating the dopant body at a temperature in the range from 900° C. to 1200° C.

DETAILED DESCRIPTION OF THE PREFERRED EMBODIMENTS

As is described above, the essential ingredients in the inventive dopant body of arsenic is silicon arsenide SiAs and silica $SiO_2$ and the dopant body is prepared by intimately mixing powders of silicon arsenide and silica in a specified proportion and shaping and sintering the powdery mixture. By virtue of this unique formulation of the powder mixture for sintering, the sintered dopant body is absolutely free from the problem of cleavage taking place in a multilayered laminar structure which is unavoidable in the conventional silicon arsenide-based dopant body.

The first essential component in the powder mixture is silicon arsenide SiAs which is a known material and can be prepared according to a known procedure, for example, described in Japanese Patent Publication No. 58-43326 from elementary arsenic and silicon by enclosing them in a sealed capsule under vacuum and heating the silicon at 1083° C. or higher and arsenic at 640° C. or higher to cause melting of them followed by cooling.

The other essential component in the powder mixture is silica $SiO_2$ which serves to increase the strengths of the sintered body of silicon arsenide. Various kinds of known silica powders can be used without particular limitations. The silica powder should have a particle diameter in the range from 1 to 5 $\mu$m. In this regard, finely pulverized powders of crystalline quartz or fused quartz glass can be used satisfactorily. The amount of the silica powder in the powder mixture is in the range from 100 to 300 parts by weight per 100 parts by weight of the silicon arsenide powder. When the amount of the silica powder is too small, the sintered body of the powder mixture cannot be imparted with sufficiently high mechanical strengths. When the amount of the silica powder is too large, on the other hand, the relative content of silicon arsenide in the sintered body is decreased so low to affect the effiency of the doping treatment of semiconductor substrates with the sintered body.

In addition to the above described powders of silicon arsenide and silica, the powder mixture may optionally contain an arsenic oxide such as $As_2O_5$, $As_2O_3$ and the like in a powdery form which may act as a binder of the other components. The amount of the arsenic oxide in the powder mixture, when added, should not exceed 200 parts by weight per 100 parts by weight of the silicon arsenide. An excessively large amount of the arsine oxide may result in an increase in the void volume in the sintered body due to increased sublimation of arsenic in the course of sintering. It is preferable that the powder mixture contains at least 50 parts by weight of the arsenic oxide per 100 parts by weight of the silicon arsenide.

The inventive sintered dopant body of arsenic can be prepared as follows. Thus, powders of silicon arsenide, silica and, optionally, arsenic oxide are mixed in a specified weight proportion and the mixture is ball-milled for 1 to 30 hours to ensure disintegration of any aggregates and to increase homogeneity of the powder mixture. The powder mixture is then granulated in a suitable granulating means, if necessary, with addition of a small amount of water as a moistening agent into granules having a diameter of, for example, about 1 mm which were compression-molded into a desired form, e.g., discs, of the green body to be subjected to sintering. The pressure in the compression molding should be in the range from 2000 to 8000 kg/cm$^2$. When the pressure is too small, the green body as molded may have a low mechanical strength to be readily broken in handling. Increase of the pressure over the above mentioned upper limit has no particular additional advantages. The form of the green body is not particularly limitative but it is an efficient way that the green body and hence the sintered body is in the form of a wafer or a thin disc having about the same diameter as that of the semiconductor wafers which are to be doped by using the inventive arsenic dopant bodies. The thickness of the wafer-like dopant body of the invention is also not particularly limitative provided that the dopant body may have a strength to withstand handling in the doping treatment of semiconductor wafers. In this regard, the thickness should be in the range from 1 to 3 mm. A too large thickness is of course economically disadvantageous.

The green body shaped by molding the powder mixture is then subjected to a sintering treatment by heating in a non-oxidizing atmosphere. The schedule of the heat treatment naturally depends on the composition of the powder mixture, dimensions of the green body and other factors. In a typical example, the green body is first kept at 200° to 300° C. for 8 to 15 hours and the, after gradual increase of the temperature, kept at 500° to 600° C. for 4 to 8 hours followed by a final stage of heating at 800° to 1200° C. or, preferably, at 900° to 1050° C. for 10 to 20 hours to be fully sintered.

The sintered dopant body prepared in the above described manner has a sufficiently high mechanical strength to withstand handling in industrial manufacturing process of semiconductor devices. The sintered body contains at least 5% by weight of arsenic even after sublimation of a considerable amount of arsenic in the course of sintering so that the sintered body is fully effective as a dopant of arsine to emit arsenic at an appropriately high temperature.

The doping treatment of a semiconductor, e.g., silicon, wafer with the inventive dopant body of arsenic can be performed by holding the silicon wafer in an inert atmosphere to face the inventive dopant body at a small distance of, for example, a few millimeters and heating them together at a temperature in the range from 900° to 1200° C. to cause evaporation of the arsenic from the dopant body. For example, a plural number of silicon wafers and a plural number of the dopant bodies in a wafer-like form are alternately held upright on a quartz glass boat in a parallel disposition at small regular intervals of, for example, a few millimeters and the boat is heated in a so-called diffusion tube in an electric furnace. The atmosphere for the doping treatment can be vacuum or filled with an inert gas such as argon and nitrogen, if necessary, with admix-ture of a small volume of oxygen to facilitate diffusion of arsenic. The length of time for the doping treatment naturally depends on the desired degree of doping and other parameters but it is usually sufficient to perform the treatment for 1 minute to several hours. In this manner, semiconductor silicon wafers can be doped with arsenic to have an N-type electroconductivity with a sheet resistance of 30 to 300 ohm.

In the following, the present invention is described in more detail by way of examples in which the term of "parts" always refers to "parts by weight".

EXAMPLE 1.

A powder mixture prepared by mixing 100 parts of silicon arsenide SiAs, 100 parts of arsenic oxide $As_2O_5$ and a fused quartz glass powder having an average particle diameter of about 5 μm, each powder having a sufficiently high purity, was ball-milled for 30 hours to give a uniform powder mixture having an average particle diameter of 1 μm. The powder mixture was moistened with addition of 2 parts of water and granulated into granules having a diameter of about 1 mm. The granules were compression-molded in a metal mold under a pressure of 2500 kg/cm$^2$ into wafer-like green bodies each having a diameter of 150 mm and a thickness of 2 mm. The wafer-like green bodies were subjected to a heat treatment first at 260° C. for 8 hours, then at 600° C. for 4 hours and finally at 950° C. for 12 hours in an atmosphere of argon gas into sintered bodies.

Three of the thus prepared wafer-like sintered bodies were subjected to the analysis with an energy-dispersion type X-ray microprobe analyzer for the contents of silicon and arsenic in the surface layer and in the core portion to find that the content of silicon in the surface layer was 79.46% to 79.59% by weight and the content of arsenic in the surface layer was 20.41% to 20.54% while the values in the core portion were 77.65% to 83.08% and 16.92% to 22.35%, respectively. An electron-microscopic examination of a crosss section of the sintered body indicated that the sintered body was at an intermediate stage growth having a grain diameter of about 5 μm as composed of a porous siliceous matrix containing crystallites of silicon arsenide uniformly dispersed therein. The wafer-like sintered bodies had a sufficiently high mechanical strength to withstand handling in a manufacturing process.

Fifty semiconductor silicon wafers having a diameter of 150 mm and a thickness of 0.5 mm and fifty-one of the above prepared wafer-like sintered dopant bodies of arsenic were held upright alternately in parallel on a quartz glass boat at a surface-to-surface distance of 3 mm. The wafers on the boat were put into a quartz glass tube in an electric furnace and heated under a stream of nitrogen at 1000° C. for 40 minutes. The thus obtained silicon wafer had an N-type electroconductivity with a sheet resistance of about 150 ohm.

EXAMPLE 2.

A powder mixture of 100 parts of silicon arsenide and 150 parts of a powder of crystalline quartz having an average diameter of about 3 μm was ball-milled for 30 hours to give a uniform powder mixture having an average particle diameter of 0.8 μm. The powder mixture was moistened with addition of 1 part of water and granulated by agitation into granules having a diameter of about 1 mm and then compression-molded and sintered in substantially the same manner as in Example 1. These sintered bodies were used for the doping treatment of silicon wafers also in the same manner as in Example 1. The thus obtained doped silicon wafers had an N-type electroconductivity with a sheet resistance of about 300 ohm on an average.

What is claimed is:

1. A dopant body of arsenic for doping of a semiconductor which is a sintered body of a powder mixture comprising 100 parts by weight of a powder of silicon arsenide and from 100 to 300 parts by weight of a silica powder.

2. The dopant body of arsenic for doping of a semiconductor as claimed in claim 1 wherein the powder mixture further comprises up to 200 parts by weight of an arsenic oxide per 100 parts by weight of the silicon arsenide.

3. The dopant body of arsenic for doping of a semiconductor as claimed in claim 2 wherein the amount of the arsenic oxide is in the range from 50 to 200 parts by weight per 100 parts by weight of the silicon arsenide.

4. The dopant body of arsenic for doping of a semiconductor as claimed in claim 1 which is in the form of a wafer.

5. A method for the preparation of a dopant body of arsenic for doping of a semiconductor which comprises the steps of:

(a) mixing 100 parts by weight of a powder of silicon arsenide and from 100 to 300 parts by weight of a silica powder to give a uniform powder mixture;

(b) compression-molding the powder mixture into a shaped body; and (c) subjecting the shaped body to a heat treatment at a temperature in the range form 800° C. to 1200° C. to give a sintered body.

6. The method for the preparation of a dopant body of arsenic for doping of a semiconductor as claimed in claim 5 wherein the powder mixture further comprises up to 200 parts by weight of an arsenic oxide per 100 parts by weight of the silicon arsenide powder.

7. The method for the preparation of a dopant body of arsenic for doping of a semiconductor as claimed in claim 5 wherein the silica powder is a powder of fused quartz glass.

8. A method for doping of a semiconductor substrate in the form of a wafer with arsenic which comprises: holding the semiconductor wafer to face a sintered dopant body of arsenic according to claim 1 in the form of a wafer in an inert atmosphere and heating the semiconductor wafer and the dopant body at a temperature in the range from 900° C. to 1200° C.

9. A method for doping of a semiconductor substrate in the form of a wafer with arsenic which comprises: holding the semiconductor wafer to face a sintered dopant body of arsenic according to claim 2 in the form of a wafer in an inert atmosphere and heating the semiconductor wafer and the dopant body at a temperature in the range from 900° C. to 1200° C.

* * * * *